(12) United States Patent
Jeng

(10) Patent No.: US 6,521,548 B2
(45) Date of Patent: Feb. 18, 2003

(54) METHOD OF FORMING A SPIN-ON-PASSIVATION LAYER

(75) Inventor: Pei-Ren Jeng, Hsin-Chu (TW)

(73) Assignee: Macronix International Co. Ltd., Hsin-Chu (TW)

(*) Notice: Subject to any disclaimer, the term of this patent is extended or adjusted under 35 U.S.C. 154(b) by 0 days.

(21) Appl. No.: 09/878,361

(22) Filed: Jun. 12, 2001

(65) Prior Publication Data

US 2002/0187653 A1 Dec. 12, 2002

(51) Int. Cl.[7] .............................................. H01L 21/31
(52) U.S. Cl. ..................... 438/782; 438/778; 438/780; 438/781; 438/788; 438/622; 438/623; 438/624
(58) Field of Search ................................ 438/782, 778, 438/780, 781, 788, 622, 623, 624

(56) References Cited

U.S. PATENT DOCUMENTS 5,270,267 A * 12/1993 Ouellet ........................ 437/231
6,372,666 B1 * 4/2002 Ramos et al. ............... 438/781

* cited by examiner

Primary Examiner—John F. Niebling
Assistant Examiner—Lynne A. Gurley
(74) Attorney, Agent, or Firm—Winston Hsu

(57) ABSTRACT

At least two neighboring metal lines are formed on a semiconductor substrate first, followed by the formation of a PE oxide layer on the semiconductor substrate, that uniformly covers the surface of the two neighboring metal lines and the gap between the two neighboring metal lines. A SOD layer on the PE oxide layer is created to fill the gap. Then the semiconductor substrate is directly heated by utilizing at least one hot plate fixed at a first predetermined temperature so as to expel the solvent out of the SOD layer. Finally, the semiconductor wafer is directly heated by utilizing a second hot plate fixed at a second predetermined temperature so as to cure the SOD layer for a predetermined time.

16 Claims, 2 Drawing Sheets

METHOD OF FORMING A SPIN-ON-PASSIVATION LAYER

BACKGROUND OF THE INVENTION

1. Field of the Invention

The present invention relates to a method of forming a passivation layer, and more particularly, a method of forming a quickly on-line cured SOD passivation layer in an oxygen controlled environment so as to increase throughput.

2. Description of the Prior Art

In a semiconductor manufacturing process, the structure of an integration circuit(IC) on a semiconductor wafer is complete after the main process steps, such as metallization and planarization. Since the main process steps are completed, these integration circuits are vulnerable to damage caused by unintentional collision or exposure to moisture. Therefore a passivation layer is formed on the surface of the semiconductor wafer in order to protect the integrated circuits.

Moreover, since the metal lines will give the surface of the integration circuits an unleveled profile, this means gaps between metal lines cannot be filled by the passivation layer and so voids are formed. The passivation layer according to the prior art utilizes spin-on-glass(SOG) material. The spin-on-glass is a silicon dioxide in solution and has good step coverage ability and flow ability. It forms the passivation layer better than the passivation layer made by a typical plasma-enhanced chemical vapor deposition(PECVD) process or high density plasma chemical vapor deposition (HDPCVD) in terms of planarization ability. The spin-on-glass passivation layer according to the prior art utilizes the spin coating technique, that comprises exposing a specific amount of silicon dioxide solution to the surface of the semiconductor wafer, performing a bake process generally termed as soft bake in order to evaporate the solvent, further performing a curing process with a higher temperature in order to transform the silicon dioxide solution to a more pure silicon dioxide in solid form.

The prior art curing process can be performed in a furnace and the semiconductor wafer after soft bake normally needs to be cured at a temperature ranging from 400 to 450° C. for from 30 minutes to several hours. Moreover, in U.S. Pat. No. 5,270,267, Ouellet et al. proposes another method of curing the passivation layer that involves curing the SOG passivation layer in a plasma environment at a temperature ranging from 200 to 400° C. in order to expel organic volatile substances, SiO Hand water molecules from the SOG passivation layer. However, the method proposed by Ouellet et al. is more expensive and also takes a long processing duration from 30 to 60 minutes which does not increase throughput. Furthermore, the prior art method is a off-line process, in other words, the semiconductor wafer needs to be stored for a period of time after the soft bake process before the hard bake (curing) process, which results in a process difference.

SUMMARY OF THE INVENTION

It is therefore a primary objective of the present invention to provide a method of forming a spin-on-passivation layer quickly so as to shorten the time required by a curing process thereby increasing throughput.

It is therefore another objective of the present invention to provide an on-line method of forming the low dielectric constant spin-on-passivation layer quickly so as to make the product with consistency and high throughput.

In the first preferred embodiment of the present invention, a semiconductor substrate is firstly provided and at least two neighboring metal lines are formed on it, followed by a plasma-enhanced chemical vapor deposition(PECVD) process performed so as to form a PE oxide layer on the semiconductor substrate, the PE oxide layer covers the surface of the neighboring two metal lines and the gap between the neighboring two metal lines uniformly. Thereafter a SOD layer is formed on the PE oxide layer and fills in the gap. After that the semiconductor substrate is heated directly by at least a first w hot plate with the temperature fixed at a first predetermined temperature to expel the solvent from the SOD layer. Finally the semiconductor substrate is directly heated by utilizing a second hot plate with a temperature fixed at a second predetermined temperature in order to cure the SOD layer for a predetermined time. The second hot plate is in an air sealed chamber and the oxygen content is controlled under 100 ppm by way of a nitrogen purge, the predetermined time is less than or equal to 10 minutes.

It is an advantage of the present invention to form the spin-on-passivation layer quickly with an on-line method so as to shorten the time required by the curing process and thereby increase the throughput.

These and other objectives of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

The present invention provides a quick curing method for spin-on-passivation layer. The spin-on-passivation layer is composed of one of the following materials: a SILK™ series product with low dielectric constant produced by Dow Chemical Co., a FLARE™ series product with a low dielectric constant produced by Allied Signal Co., a polyarylether polymer compound, and other similar spin-on-dielectric (SOD) material with low dielectric constant. However, the present invention is not limited to these, other spin-on materials which can be cured with a hot plate, such as inorganic SOG materials can be applied in the present invention.

The present invention can be fabricated at a semiconductor wafer process station equipped with an on-line automatic robot, spin-on stage, soft bake hot plate and curing equipment. For instance, the CALYPSO™ series produced by FSI International or other similar equipment. The curing equipment in the process station comprises at least an oxygen controlled air sealed chamber in order to control the oxygen content under 100 ppm, and a hot plate in order to directly, precisely, uniformly and quickly heat the semiconductor wafer to between 200 and 450° C.

Figure 1:
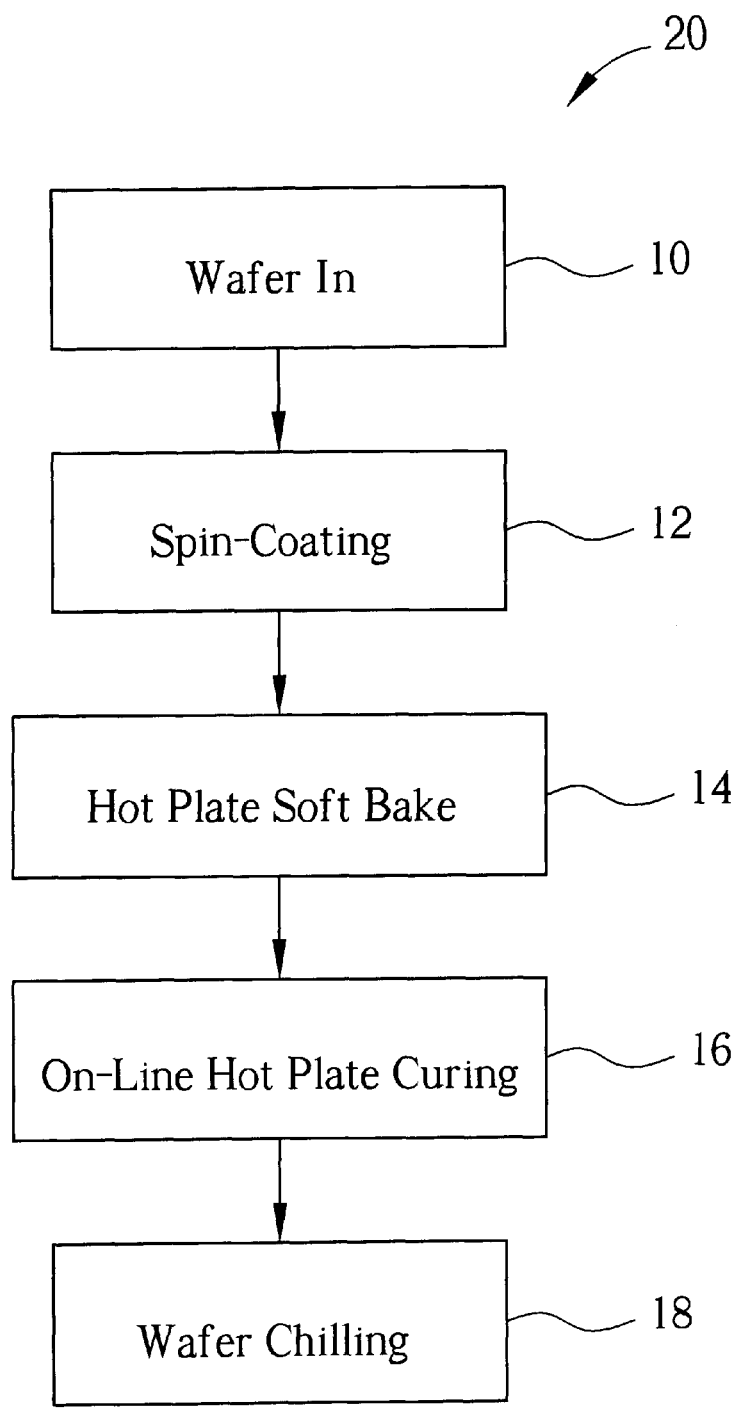
FIG. 1 is a flow chart of the process for forming the spin-on-passivation layer quickly according to the present invention.

Please refer to FIG. 1, FIG. 1 is a flow chart 20 of the process for forming the spin-on-passivation layer quickly according to the present invention. As shown in FIG. 1, firstly a semiconductor wafer with completed metallization and a plurality of shallow trenches is provided, it could be a semiconductor wafer 200 mm or 300 mm in diameter(step 10). Then a spin-on process with a velocity at several thousand rpm is performed in order to form a spin-on material layer on the rotational spinning stage, such as the spinning on of a spin-on-dielectric layer(step 12). It should be noted that before performing the step 12 in prior art method, those skilled in the art can perform an additional precursor spin-on process and an edge bevel rinse (EBR) process optionally depending on the sticking characteristic between the spin-on material layer and the surface of the semiconductor wafer.

Thereafter, the spinned semiconductor wafer is transported to a hot plate and a soft bake is performed for several seconds in a dust free atmospheric environment (step 14). The treatment time for soft bake is very short, normally several minutes. The number of hot plates for soft bake is usually 1 to 3, and are fixed at different temperatures, normally ranging from 50 to 250° C. The objective for soft bake is to expel the solvent from the spin-on material layer on the semiconductor wafer.

Still as shown in FIG. 1, following that an on-line curing process is employed to heat the semiconductor wafer directly by utilizing a hot plate fixed at a higher temperature so as to cure the spin-on material layer on the semiconductor wafer(step 16). The curing time is less than or equal to 10 minutes, normally between 3 to 5 minutes. As mentioned above, during the curing process according to the present invention, the hot plate is in an air sealed chamber with an oxygen content controlled under 100 ppm. The air sealed chamber can be purged with nitrogen gas and the hot plate is fixed at the temperature between 350 and 500° C. After completing the curing process, the semiconductor wafer is cooled down to between 15 and 35° C.(step 18).

Figure 2:
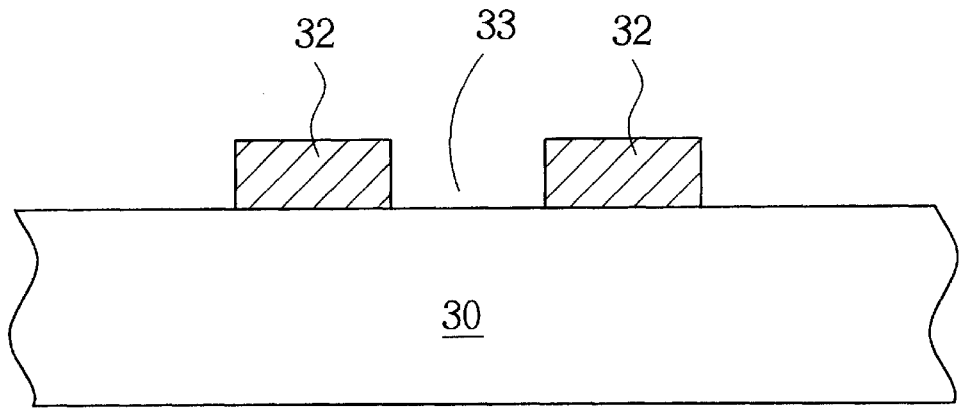
FIG. 2 to FIG. 4 are schematic diagrams of the process for the first preferred embodiment according to the present invention.
Figure 3:
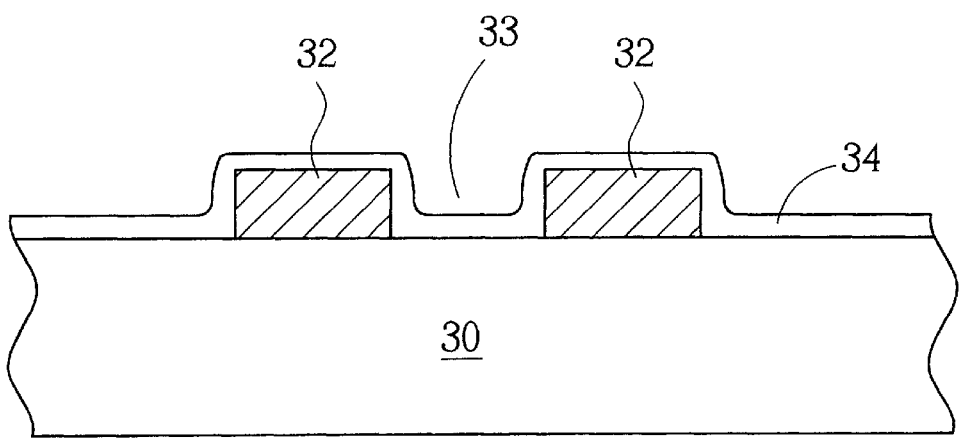
Figure 4:
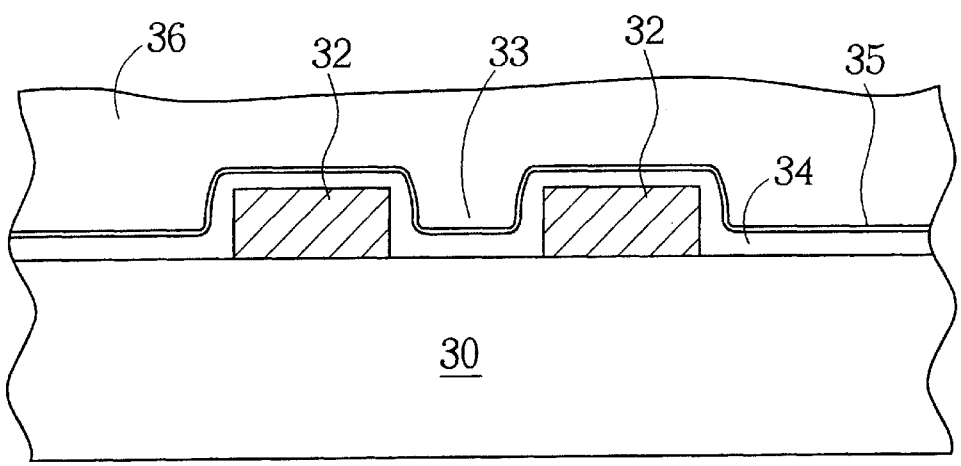

Please refer to FIG. 2 to FIG. 4, FIG. 2 to FIG. 4 are schematic diagrams of the process for the first preferred embodiment according to the present invention. Firstly as shown in FIG. 2, a semiconductor wafer 40 comprising a semiconductor substrate 30 is provided. In the preferred embodiment of the present invention, the semiconductor substrate 30 is a semi-product with completed metallization, for example, a mask read only memory (MROM) with completed word lines. In order to simplify the main point of the technique in the present invention, devices fabricated on the semiconductor substrate 30, such as transistor, capacitor, inter metal dielectric(IMD) or word lines are not shown in FIG. 2 to FIG. 4. In FIG. 2, at least two neighboring metal lines 32 had been formed on the semiconductor substrate 30, with the width of a gap 33 between the two neighboring metal lines 32 less than 0.18 μm.

As shown in FIG. 3, a plasma-enhanced chemical vapor deposition(PECVD) process forms a PE oxide layer 34 on the semiconductor substrate 30, the PE oxide layer 34 uniformly covers the surface of the two neighboring metal lines 32 and the gap 33 between the two neighboring metal lines 32. The thickness of the PE oxide layer 34 is between several tens and several hundreds angstroms and is used to protect the metal lines 32 in order to avoid erosion by moisture in the subsequent process.

As shown in FIG. 4, thereafter a precursor spin-on process and an edge bevel rinse (EBR) process form a glue layer 35 on the surface of the PE oxide layer 34. Then a SOD layer 36 with a thickness ranging from several hundreds to several thousands angstroms on the glue layer 35 fills the gap 33 between the two neighboring metal lines 32. In the preferred embodiment of the present invention, the SOD layer 36 comprises SILK-H™ product by Dow Chemical Co with a low dielectric constant produced. Also the spin-on process is performed at a semiconductor wafer process station equipped with an on-line automatic robot, spin-on stage, soft bake hot plate and curing equipment, as can be seen in the CALYPSO™ series produced by FSI international or other similar equipment. Then, the semiconductor wafer 40 is transported to another working area for soft bake. In the preferred embodiment of the present invention, three hot plates are utilized to directly heat the semiconductor wafer 40 in order to expel the solvent from the SOD layer 36. The temperature of the three hot plates are fixed at 150° C., 200° C. and 250° C., and the duration of oft bake is sixty seconds for each hot plate.

Thereafter a robot will transport the semiconductor wafer 40 into an air sealed chamber(not shown), and utilize a hot plate with a temperature fixed between 400 and 450° C. to directly heat the semiconductor wafer 40 for 3 to 5 minutes in order to cure the SOD layer 36. The oxygen content of the air sealed chamber is controlled at 50 ppm by way of a nitrogen purge.

Compared to the prior art method, the present method can decrease the time for SOD layer 36 curing and increase the throughput.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a spin-on-passivation layer quickly on a semiconductor wafer, the method comprising:

spinning on a spin-on-dielectric (SOD) layer on the semiconductor wafer;

performing a first stage curing process by utilizing a plurality of first hot plates fixed at different temperatures to heat the semiconductor wafer so as to expel solvent from the SOD layer; and performing a second-stage curing process by utilizing a second hot plate to heat the semiconductor wafer to cure the SOD layer for a predetermined time, the second hot plate disposed in an air-sealed chamber having an oxygen content that is under 100 ppm;

wherein the temperature of the second hot plate is fixed at a second predetermined temperature that is higher than the temperatures of the first hot plates, and the predetermined time is less than or equal to ten minutes.

2. The method of claim 1 wherein the SOD layer is composed of SILK™.

3. The method of claim 2 wherein the SOD layer is composed of SiLK-H™.

4. The method of claim 1 wherein the SOD layer is composed of FLARE™.

5. The method of claim 1 wherein the temperatures of the first hot plates range from 120° C. to 250° C.

6. The method of claim 1 wherein the second predetermined temperature ranges from 350° C. to 500° C.

7. The method of claim 6 wherein the second predetermined temperature ranges from 400° C. to 450° C.

8. The method of claim 6 wherein the predetermined time is between 3 and 5 minutes.

9. A method of forming a spin-on-passivation layer quickly, the method comprising:

providing a semiconductor wafer and forming at least two neighboring metal lines on the semiconductor wafer;

performing a plasma-enhanced chemical vapor deposition (PECVD) process so as to form a PE oxide layer on the semiconductor wafer, the PE oxide layer covering the surface of the two neighboring metal lines and a gap between the neighboring metal lines;

spinning on a spin-on-dielectric (SOD) layer on the PE oxide layer that fills the gap;

heating the semiconductor wafer by utilizing a plurality of first hot plates having temperatures fixed at different temperatures so as to expel solvent from the SOD layer; and heating the semiconductor wafer by utilizing a second hot plate having a temperature fixed at a second predetermined temperature so as to cure the SOD layer for a predetermined time;

wherein the second hot plate is disposed in an air-sealed chamber, the oxygen content of the air-sealed chamber is under 100 ppm by way of a nitrogen purge, and the predetermined time is less than or equal to ten minutes.

10. The method of claim 9 wherein the SOD layer is composed of SiLK™.

11. The method of claim 10 wherein the SOD layer is composed of SiLK-H™.

12. The method of claim 9 wherein the SOD layer is composed of FLARE™.

13. The method of claim 9 wherein the temperatures of the first hot plates range from 120° C. to 250° C.

14. The method of claim 9 wherein the second predetermined temperature ranges from 350° C. to 500° C.

15. The method of claim 14 wherein the second predetermined temperature ranges from 400° C. to 450° C.

16. The method of claim 9 wherein the predetermined time is between 3 and 5 minutes.

* * * * *